United States Patent
Chen et al.

(10) Patent No.: US 10,106,889 B2
(45) Date of Patent: Oct. 23, 2018

(54) WAVEGUIDES INCLUDING NOVEL CORE MATERIALS

(71) Applicant: SEAGATE TECHNOLOGY LLC, Cupertino, CA (US)

(72) Inventors: Song Chen, Edina, MN (US); Xiaoyue Huang, Eden Prairie, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 14/937,669

(22) Filed: Nov. 10, 2015

(65) Prior Publication Data
US 2016/0133287 A1    May 12, 2016

Related U.S. Application Data

(60) Provisional application No. 62/078,102, filed on Nov. 11, 2014.

(51) Int. Cl.
| | | |
|---|---|---|
| G11B 5/127 | (2006.01) | |
| C23C 16/32 | (2006.01) | |
| G02B 6/122 | (2006.01) | |
| G02B 1/04 | (2006.01) | |
| G11B 5/187 | (2006.01) | |
| G11B 5/60 | (2006.01) | |
| G11B 5/31 | (2006.01) | |
| G02B 6/00 | (2006.01) | |
| G02B 6/12 | (2006.01) | |
| G11B 5/00 | (2006.01) | |
| G11B 5/48 | (2006.01) | |
| G11B 5/012 | (2006.01) | |

(52) U.S. Cl.
CPC ........... *C23C 16/325* (2013.01); *G02B 1/046* (2013.01); *G02B 6/00* (2013.01); *G02B 6/122* (2013.01); *G11B 5/127* (2013.01); *G11B 5/187* (2013.01); *G11B 5/314* (2013.01); *G11B 5/6088* (2013.01); *G02B 2006/12035* (2013.01); *G11B 5/012* (2013.01); *G11B 5/4866* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 5,987,046 | A | 11/1999 | Kobayashi |
| 6,009,064 | A | 12/1999 | Hajjar |

(Continued)

FOREIGN PATENT DOCUMENTS

| | | | |
|---|---|---|---|
| JP | 2006-073105 | 3/2006 | |
| JP | 2011-100535 | 5/2011 | |
| WO | WO 2013163470 A1 * | 10/2013 | ............. G11B 5/314 |

OTHER PUBLICATIONS

Translation of JP2003-243385A, Kishimoto into English.*

*Primary Examiner* — Brian Butcher
(74) *Attorney, Agent, or Firm* — Mueting, Raasch & Gebhardt, P.A.

(57) ABSTRACT

Waveguides that include a top cladding layer; a bottom cladding layer; and a core layer positioned between the top cladding layer and the bottom cladding layer, the core layer including a material having a refractive index of not less than 2.1, for example amorphous hydrogenated silicon carbide (SiC:H), or bismuth titanate. Methods of forming core layers of waveguides are also disclosed.

20 Claims, 4 Drawing Sheets

(56) References Cited

U.S. PATENT DOCUMENTS

| | | |
|---|---|---|
| 6,574,257 B1 | 6/2003 | Thronton |
| 6,950,598 B1 | 9/2005 | Tawa |
| 7,852,587 B2 | 12/2010 | Albrecht |
| 8,098,547 B2 | 1/2012 | Komura |
| 8,200,054 B1 | 6/2012 | Li |
| 8,295,010 B2 | 10/2012 | Shimazawa |
| 8,385,183 B2 | 2/2013 | Peng |
| 8,411,536 B1 | 4/2013 | Peng |
| 8,456,966 B1 | 6/2013 | Shi |
| 8,509,037 B1 | 8/2013 | Huang |
| 8,588,039 B1 | 11/2013 | Shi |
| 8,675,457 B1 | 3/2014 | Hirata |
| 8,760,979 B1 * | 6/2014 | Chou ............... G11B 5/314 369/13.13 |
| 8,780,678 B2 | 7/2014 | Iwanabe |
| 8,787,130 B1 | 7/2014 | Yuan |
| 2002/0067690 A1 | 6/2002 | Tominaga |
| 2006/0029348 A1 | 2/2006 | Kempen |
| 2006/0062521 A1 | 3/2006 | Zhou |
| 2006/0090178 A1 | 4/2006 | Stipe |
| 2006/0143635 A1 | 6/2006 | Liu |
| 2007/0116409 A1 | 5/2007 | Bryan |
| 2008/0239541 A1 | 10/2008 | Shimazawa |
| 2010/0061200 A1 | 3/2010 | Shimazawa |
| 2010/0074062 A1 | 3/2010 | Kamijima |
| 2010/0074063 A1 | 3/2010 | Peng |
| 2010/0091618 A1 | 4/2010 | Schabes |
| 2010/0165822 A1 | 7/2010 | Balamane |
| 2010/0196588 A1 | 8/2010 | Lao |
| 2010/0290323 A1 | 11/2010 | Isogai |
| 2010/0321815 A1 | 12/2010 | Zhou |
| 2011/0013497 A1 | 1/2011 | Sasaki |
| 2011/0090770 A1 | 4/2011 | Iwanabe |
| 2011/0103201 A1 | 5/2011 | Peng |
| 2012/0070784 A1 | 3/2012 | Balamane |
| 2012/0251043 A1 | 10/2012 | Shacklette |
| 2012/0257490 A1 | 10/2012 | Zhou |
| 2012/0275280 A1 | 11/2012 | Miyauchi |
| 2013/0068722 A1 | 3/2013 | Sasaki |
| 2013/0083637 A1 | 4/2013 | Zhou |
| 2013/0114385 A1 | 5/2013 | Nakai |
| 2013/0279313 A1 | 10/2013 | Huang |
| 2014/0212088 A1 * | 7/2014 | Ohira ............... G02B 6/29344 385/24 |

* cited by examiner

US 10,106,889 B2

WAVEGUIDES INCLUDING NOVEL CORE MATERIALS

PRIORITY

This application claims priority to U.S. Provisional Application No. 62/078,102 entitled "WAVEGUIDES INCLUDING NOVEL CORE MATERIALS" filed on Nov. 11, 2014, the disclosure of which is incorporated herein by reference thereto.

BACKGROUND

In thermally assisted magnetic/optical recording, information bits are recorded to a storage layer of a storage media at elevated temperatures. Generally, a spot or bit on the storage medium is heated to reduce its coercivity sufficiently so that an applied magnetic field or optical write signal can record data to the storage medium. Current methods of heating the storage media include directing and focusing energy onto the storage media. Different and more advantageous methods and devices for focusing the energy are needed in order to decrease the size of the heated spot in order to increase the storage density of the storage media.

SUMMARY

Disclosed is a waveguide that includes a top cladding layer; a bottom cladding layer; and a core layer positioned between the top cladding layer and the bottom cladding layer, the core layer including amorphous hydrogenated silicon carbide (SiC:H), or bismuth titanate.

Also disclosed is an apparatus that includes a light source; a near field transducer (NFT); and a waveguide, the waveguide including a top cladding layer; a bottom cladding layer; and a core layer positioned between the top cladding layer and the bottom cladding layer, the core layer including amorphous hydrogenated silicon carbide (SiC:H), or bismuth titanate, wherein the NFT is configured to receive light from the light source and transmit it to the waveguide Further disclose are methods of forming a waveguide, the methods including depositing a layer of hydrogenated amorphous silicon carbide (SiC:H); and annealing the deposited layer of hydrogenated amorphous silicon carbide (SiC:H).

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

Disclosed devices can offer the advantage of providing more confined light propagation and also allow the design of thinner core thicknesses, which can deliver a more focused thermal spot onto the recording media by increasing the thermal gradient. These advantages are realized through the use of different core material. Disclosed devices include core materials that have higher refractive indices while still maintaining very low optical loss at relevant wavelengths. In some embodiments, disclosed devices can be used within other devices or systems, such as magnetic recording heads, more specifically, thermally or heat assisted magnetic recording (HAMR) heads, or disc drives that include such devices.

Figure 1:
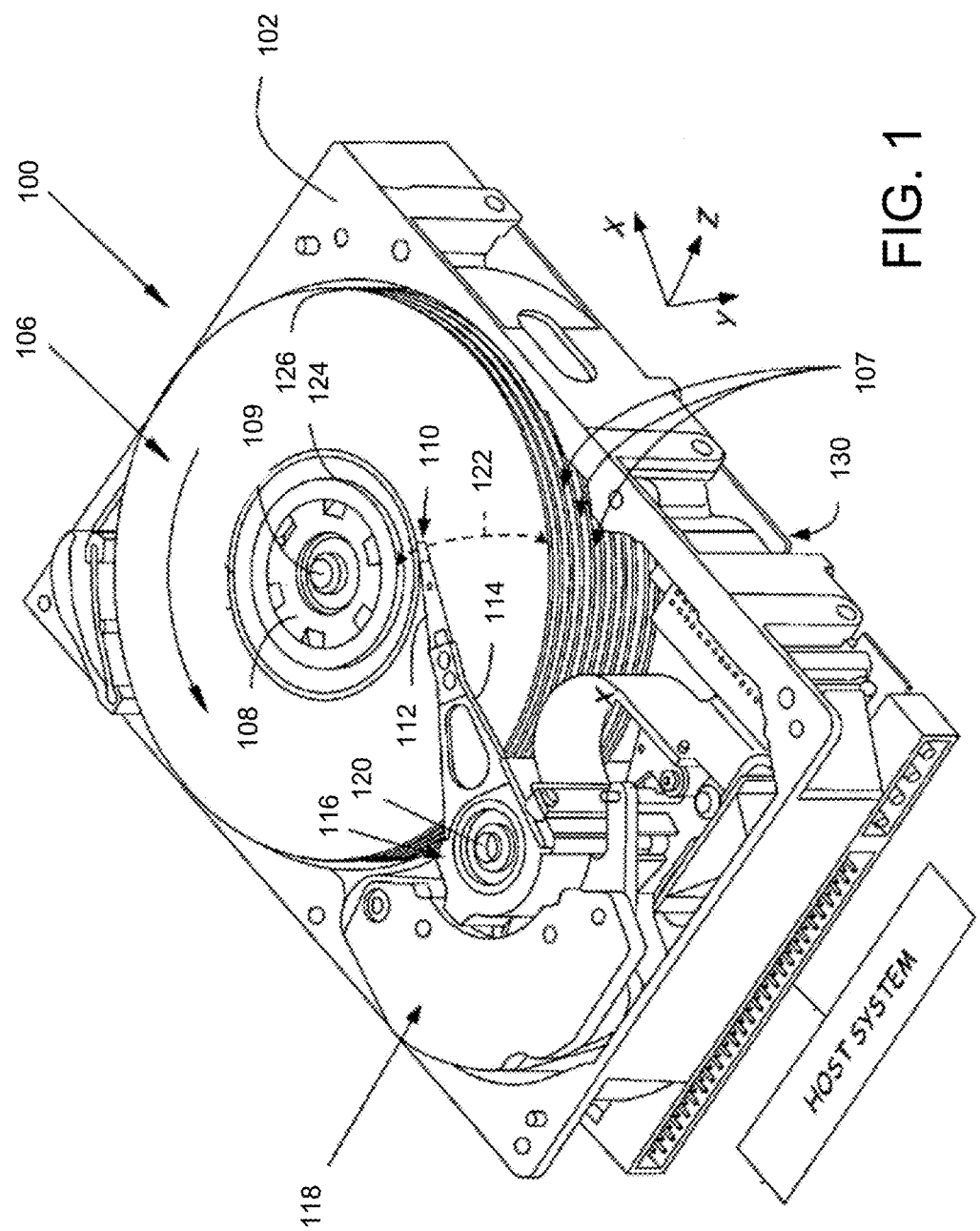
FIG. 1 is an isometric view of a system including a disc drive.

FIG. 1 is an isometric view of a disc drive 100 in which disclosed devices such as disclosed optical devices may be useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

In general, the disc head slider 110 supports a recording head that can include disclosed optical devices. Disclosed optical devices included in the disc head slider 110 can be utilized to direct focused energy onto a surface of a disc 107 of the disc pack 106 to provide heat-assisted recording. A control circuit included with the servo electronics 130 or co-located with the servo electronics 130 along a bottom portion of the disc drive 100 may be used to control a position of the slider 110 and the associated read/write head relative to one of the individual discs 107 of the disc pack 106.

Figure 2:
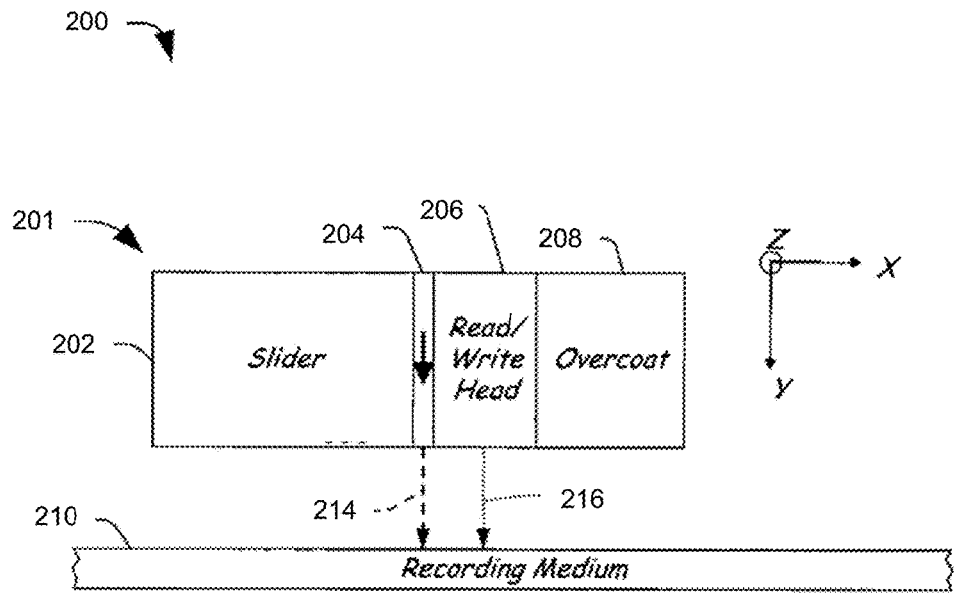
FIG. 2 is a block diagram of a particular illustrative embodiment of a recording head including a waveguide in communication with an illustrative recording medium.

FIG. 2 is a block diagram of a particular illustrative embodiment of a system 200 including a recording head 201 having an optical device 204 such as those depicted herein. The system 200 includes a recording medium 210 located perpendicular to a Y-axis of the optical device 204. The recording head 201 includes an air-bearing slider 202 that flies over the surface of the recording medium 210 and that is adapted to be adjusted in the X-direction and the Z-direction and that maintains a fly-height over the surface of the recording medium 210 in the Y-direction based on airflow. The air-bearing slider 202 is coupled to a read/write head 206, which is adjacent to the optical device 204. The optical device 204 focuses evanescent waves energy toward the surface of the recording medium 210. The recording head 201 can optionally include overcoat layer 208 that functions to protect the read/write head 206.

In a particular embodiment, the optical device directs focused energy 214 onto the surface of the recording medium 210 to heat a local area of the recording medium 210 to reduce a coercivity of the local area. Concurrently, the read/write head 206 directs a recording field 216 onto the recording medium 210 in the heated local area to record data to the recording medium.

Figure 3:
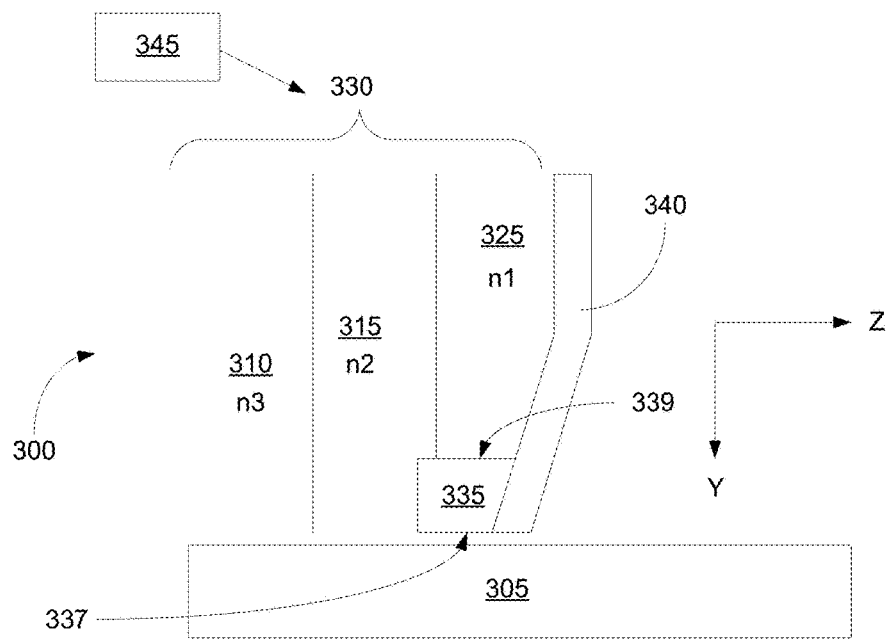
FIG. 3 is a partial cross section of a disclosed device.

FIG. 3 shows a device 300. The device 300 can generally include a waveguide, or an optical waveguide 330. The waveguide 300 can include a bottom cladding layer or structure 310, a core layer or structure 315 and a top cladding layer or structure 325. The bottom cladding layer 310 can generally be positioned adjacent the core layer 315 and the core layer 315 is generally positioned adjacent the top cladding layer 325. Stated another way, the core layer 315 is between the top cladding layer 325 and the bottom cladding layer 310. Additional layers could also be included in waveguides. Such optional layers could include assistant layers such as those discussed in U.S. Pat. No. 8,873,349, the disclosure of which is incorporated herein by reference thereto.

The top cladding layer 325 generally includes or can be made of a material that has an index of refraction, n1. The core layer 315 generally includes or can be made of a material that has an index of refraction, n2. In some embodiments, discussed herein below, the core layer 315 can itself be a multilayer structure. The bottom cladding layer 310 generally includes or can be made of a material that has an index of refraction, n3.

Generally, neither n1 nor n3 are greater than n2. n1 and n3 may be the same, substantially the same, or may be different. In some embodiments n1 and n3 are at least substantially the same as they are made of the same material. In some embodiments n1 and n3 are not substantially the same, as they are made of different materials.

In some embodiments, the bottom cladding layer 310 may be formed of a material such as, for example $SiO_2$, $MgF_2$, $Al_2O_3$, porous silica, or combinations thereof. In some embodiments, the bottom cladding layer 310 can be formed of a material that has advantageous properties, for example, the material can have advantageous corrosion resistant properties. Corrosion resistance can be important because the bottom cladding layer 310 is exposed to the air bearing surface (ABS) of the device. In some embodiments, the bottom cladding layer can be made of $SiO_2$, for example. In some embodiments, the top cladding layer 325 may be formed of a material such as, for example $SiO_2$, $MgF_2$, $Al_2O_3$, $Si_3N_4$, $SiO_xN_y$, porous silica, or combinations thereof. The top and bottom cladding layers can be the same or different materials.

In some embodiments, the material of the core layer 315 may have a refractive index (n3) of not less than 2.1, not less than 2.3 or not less than 2.5. In contrast, the material of either or both of the bottom and top cladding layers 310 and 325 may have a refractive index of about 1.0 to about 2.0. By forming the core layer 315 with a higher refractive index than the cladding layers, the core layer 315 is able to more efficiently guide a propagating or guided electromagnetic planar waveguide mode by total internal reflection. In some embodiments, by increasing the ratio of the core layer 315 refractive index to the cladding layers' refractive index (for the refractive index ranges stated herein), the energy of the propagating or guided mode can be more greatly confined within the core layer 315. As used herein, the term propagating or guided electromagnetic planar waveguide mode generally refers to optical modes which are presented as a solution of the eigenvalue equation, which is derived from Maxwell's equations subject to the boundary conditions generally imposed by the waveguide geometry.

In some embodiments, the core layer 315 may be formed of a material having a refractive index of not less than 2.3 or not less than 2.5. In some embodiments, the core layer may be formed of hydrogenated amorphous silicon carbide (SiC:H). In some embodiments, the core layer may be formed of bismuth titanate ($Bi_4Ti_3O_{12}$).

Hydrogenated amorphous silicon carbide (SiC:H) generally has a refractive index of not less than 2.1, not less than 2.3, or not less than 2.5, while at the same time it maintains very low optical loss at relevant wavelengths (e.g., about 830 nm). The relatively high refractive indices that SiC:H can provide can enable more efficient light delivery by the waveguide, thereby lowering the necessary operating power of the laser diode. Furthermore, SiC:H can also be advantageously resistant to corrosion by typical acids. This can enhance the reliability of the material at the air bearing surface (ABS). Hydrogenated amorphous silicon carbide can be formed or deposited using chemical vapor deposition (CVD), for example. The deposition, for example via CVD, can be followed by post annealing. In some embodiments, the annealing can be accomplished at temperatures from 200° C. to 400° C., for example. Hydrogenated amorphous silicon carbide can be identified and/or detected by using energy dispersive X-ray spectroscopy (EDX). In some embodiments the EDX analysis can be preceded by preparation of the sample of interest with focused ion beam and transmission electron microscopy. One of a number of alternatives to EDX can include Fourier transform infrared spectroscopy (FTIR). FTIR can be utilized to detect the chemical bonding in the material of the core.

In embodiments where CVD is utilized to prepare the SiC:H, any of a number of precursors can be utilized as carbon sources, including for example methane ($CH_4$), propene ($C_3H_6$), propane ($C_3H_8$), hexane ($C_6H_{14}$), xylene ($C_8H_{10}$), or combinations thereof. Silicon sources can include, for example, silane ($SiH_4$), disilane ($Si_2H_6$), tetrachlorosilane ($SiCl_4$), or combinations thereof. In some embodiments, the deposition can be done at temperatures that are not above 225° C., for example. Various dilution/carrying gases can be utilized, including for example argon (Ar) and helium (He).

Optical properties, such as the refractive index (n) and extinction coefficient (k) of the SiC:H can be controlled, at least in part by the ratio of carbon and silicon precursors utilized for CVD. Generally, as the amount of silicon in the SiC:H increases, the refractive index of the SiC:H increases. Conversely, the amount of carbon in the SiC:H increases, the refractive index of the SiC:H decreases. In some embodiments, the amount of carbon in the SiC:H is not greater than 60%, not greater than 50%, not greater than 48%, not greater than 46%, not greater than 44%, not greater than 42%, not greater than 40%, not greater than 38%, not greater than 34%, not greater than 30%, or not greater than 29%.

In some embodiments, the amount of carbon and silicon can be controlled by controlling the flow rates of precursor gases to the CVD chamber. The flow rates of the precursor gases are of course dependent, at least in part on the number of precursor atoms provided by the gas (e.g., the flow rate of methane would likely be higher than that of xylene because xylene provides eight (8) times the carbon). In some embodiments, a carbon source can have a flow rate not less than 120 standard cubic centimeters per minute (sccm), not less than 200 sccm, or not less than 5000 sccm, depending at least in part on the particular chemical composition of the carbon source. In some embodiments, a carbon source can have a flow rate not greater than 7000 sccm, not greater than 1000 sccm, or not greater than 6000 sccm, depending at least in part on the particular chemical composition of the carbon source. In some embodiments, a silicon source can have a flow rate of not less than 100 sccm, or not less than 200 sccm, depending at least in part on the particular chemical composition of the silicon source. In some embodiments, a silicon source can have a flow rate of not greater than 500 sccm, or not greater than 300 sccm, depending at least in part on the particular chemical composition of the silicon source.

Once the SiC:H has been deposited, the material can be annealed. Annealing the deposited material can serve to further decrease the intrinsic optical transition in the near-infrared region and make the material particularly advantageous for use as a core layer of a waveguide at relevant wavelengths (e.g., 830 nm). In some embodiments, post annealing can utilize temperatures not less than 200° C., not less than 210° C., or not less than 220° C., for example. In some embodiments, post annealing can utilized temperatures not greater than 250° C., not greater than 240° C., or not greater than 230° C., for example.

Bismuth titanate ($Bi_4Ti_3O_{12}$) generally has a refractive index of not less than 2.1, not less than 2.3, not less than 2.4, or not less than 2.5, while at the same time maintaining very low optical loss at relevant wavelengths (e.g., about 830 nm). The relatively high refractive indices that bismuth titanate can provide can enable more efficient light delivery by the waveguide, thereby lowering the necessary operating power of the laser diode. Bismuth titanate can be formed or deposited using magnetron sputtering, for example. The deposition, for example via magnetron sputtering, can be followed by post annealing. The post annealing may be carried out at temperatures from 200° C. to 400° C., for example about 300° C. Bismuth titanate can be identified and/or detected by using metrology methods, including for example EDX, x-ray diffraction (XRD), or combinations thereof as well as other methods.

Bismuth titanate can be deposited using magnetron sputtering for example. In some embodiments, bismuth titanate can be sputtered from a target of bismuth titanate ($Bi_4Ti_3O_{12}$). It should be noted that any other forms of bismuth and titanium composition may change the properties desired in the sputtered films. Illustrative other forms that in some embodiments are not present in any substantial quantity (e.g., any more than impurity levels) can include for example $Bi_{12}TiO_{20}$, $Bi_2Ti_4O_{11}$, $Bi_2Ti_2O_7$.

The optical waveguide 330 can be positioned adjacent other structures, and in embodiments can be configured to work in connection with other structures or devices. The embodiment of the optical waveguide 330 depicted in FIG. 3 is configured adjacent a magnetic pole 340, and a near field transducer-heat sink (NFT-HS).

In some embodiments, the core layer 315 may have a thickness, in the z direction (see FIG. 3), of not less than 100 nm and not greater than 150 nm. In some embodiments, disclosed core layers can have a thickness in the z direction of not less than 75 nm, not less than 80 nm, or not less than 85 nm, for example. In some embodiments, disclosed core layers can have a thickness in the z direction of not greater than 110 nm, not greater than 100 nm, or not greater than 95 nm, for example. Core layers that have a thinner dimension in the z direction can be advantageous because they may provide a better thermal gradient on the media. The bottom cladding layer 310 may have a thickness in the z direction, of 200 nm to 2000 nm. The bottom cladding layer 310 should be sufficiently thick such that the electric field from the propagating waveguide mode does not extend appreciably beyond the bottom cladding layer 310 and thereby interact with any materials or structure outside of the waveguide 330. In some embodiments, increasing the ratio of the core layer 315 thickness to the bottom cladding layer 310 thickness (for the thickness ranges stated herein), the energy of the propagating mode can be more greatly confined within the core layer 315.

The device 300 depicted in FIG. 3 includes not only an optical waveguide 330, but also a near field transducer-heat sink (referred to herein as NFT-HS) 335 and a magnetic pole 340. The NFT-HS can be a single structure that functions as both a near field transducer and a heat sink or it can be a multi-part structure which as a whole functions as a near field transducer and a heat sink. In some embodiments, the NFT-HS can be a peg/disc type of NFT, which can also be referred to as a lollipop structure, a gap type of NFT, or a funnel-type NFT for example. The near field transducer function of the NFT-HS functions to condense incoming light rays to a location on the magnetic media disc 305, while the heat sink function of the NFT-HS functions to funnel heat, which is generated by the NFT function, away from the NFT structure. The NFT-HS 335 can be described as having an air bearing surface 337. The air bearing surface 337 is adjacent the magnetic media disc 305. The NFT-HS 335 also has a back surface 339, which is the opposite or opposing surface as the air bearing surface 337. The magnetic pole 340 can generally function as a write pole in a read-write head. Although the examples discussed herein depict perpendicular magnetic recording heads, it will be appreciated that the embodiments depicted herein may also be used in conjunction with other types of recording heads and/or storage media where it may be useful to employ heat assisted magnetic recording.

The location of some of the components of the waveguide 330 can be further described with respect to the location of the NFT-HS 335 and the magnetic pole 340. The position of the top cladding layer 325 can be described as being positioned adjacent the back surface 339 of the NFT-HS 335. The positioned of the top cladding layer 325 can also be described as being positioned adjacent the magnetic pole 340. In some embodiments, the top cladding layer 325 can extend beyond (in the z direction) the magnetic pole 340.

The device depicted in FIG. 3 also includes a light source 345. The light source 345 is configured to generate light, which is directed into the optical waveguide 330. More specifically, the light source 345 and optical waveguide 330 are configured so that light from the light source is received by the waveguide and directed out the waveguide into the NFT-HS. Other devices and structures not depicted herein could be utilized to direct the light from the light source 345 into the optical waveguide 330. Exemplary types of structures or devices can include, for example, solid immersion mirrors including parabolic mirrors for example, mode index lenses, and three-dimensional channel waveguides. Exemplary types of light sources can include, for example laser diodes, light emitting diodes (LEDs), edge emitting laser diodes (EELs), vertical cavity surface emitting lasers (VCSELs), and surface emitting diodes.

The present disclosure is illustrated by the following examples. It is to be understood that the particular examples, assumptions, modeling, and procedures are to be interpreted broadly in accordance with the scope and spirit of the invention as set forth herein.

EXAMPLES

To illustrate a specific embodiment of a disclosed core layer material, SiC:H was deposited using propene ($C_3H_6$) as the carbon source at a flow rate of 120 sccm and silane ($SiH_4$) as the silicon source at a flow rate of 600 sccm. Argon (Ar) at 5000 sccm and helium (He) at 2000 sccm were utilized as the dilution/carrying gases. The top plasma power was 800 W. The chamber pressure was 4.8 Torr. The deposition rate reached as high as 110 Å/second at the wafer temperature of 225° C. The materials were annealed in a vacuum at 225° C. for 1 hour. The film had a refractive index (at a wavelength of 830 nm) of 2.5 and an optical loss of about 10 dB/cm.

Figure 4:
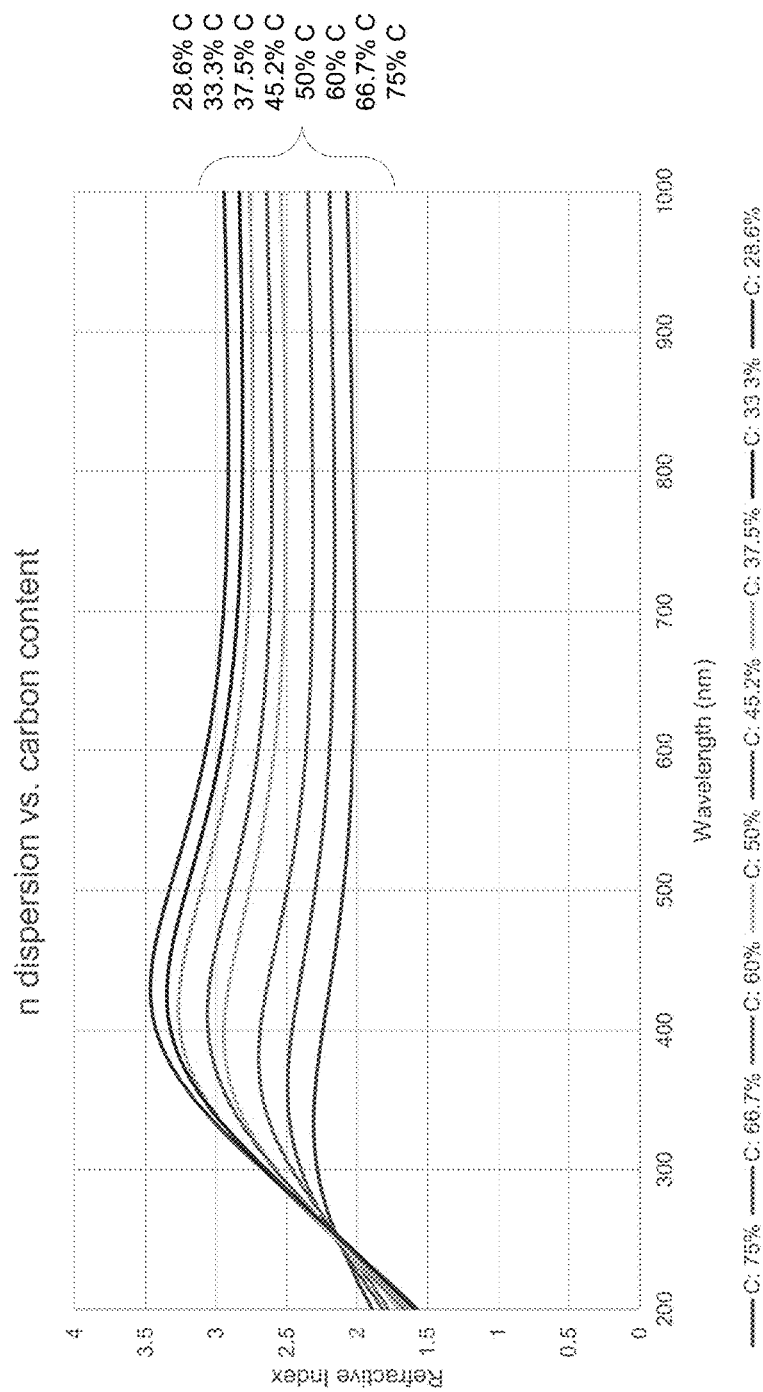
FIG. 4 is a graph of the refractive index (n) as a function of wavelength for hydrogenated amorphous silicon carbide (SiC:H) having different carbon contents.
Figure 5:
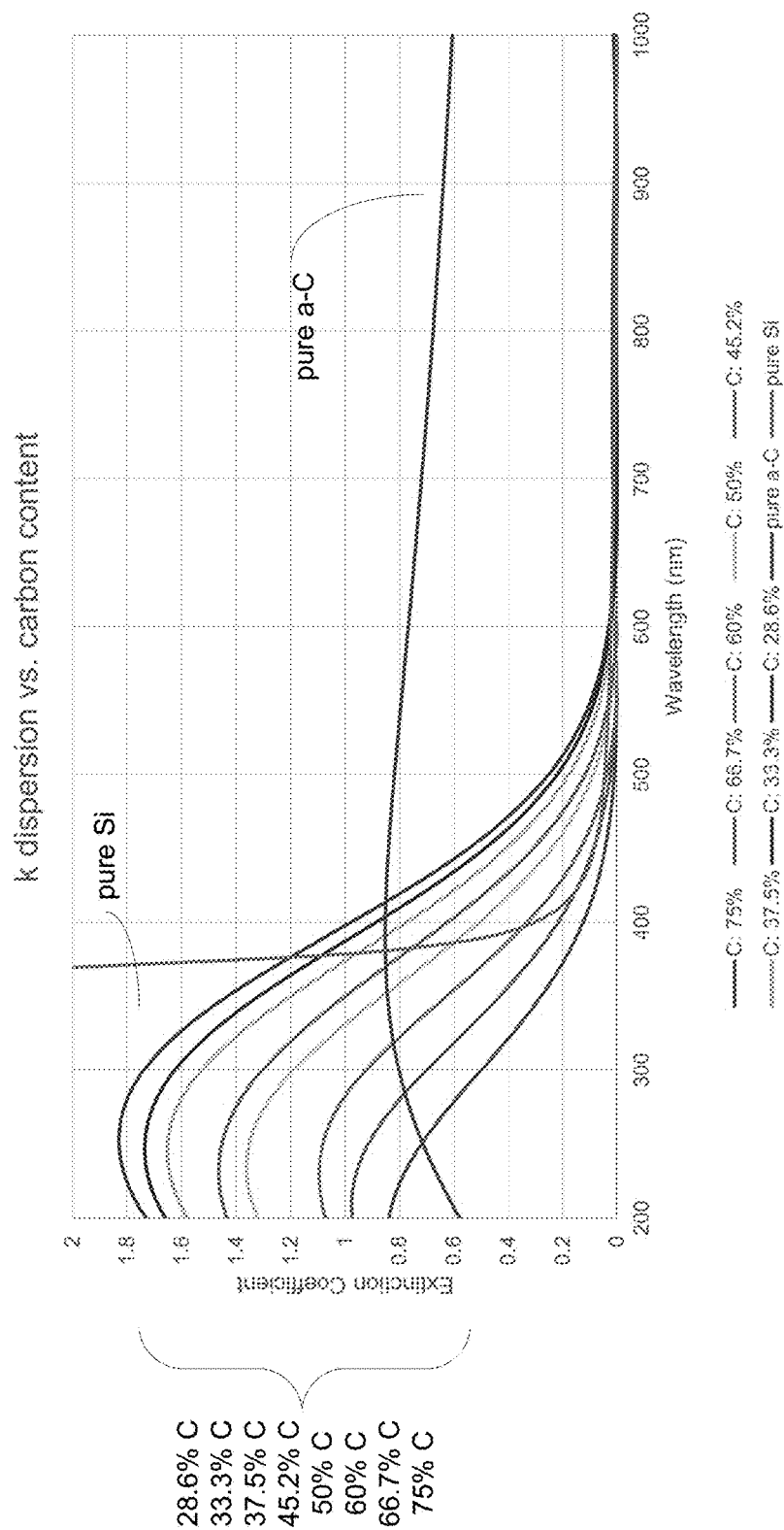
FIG. 5 is a graph of the extinction coefficient as a function of wavelength for hydrogenated amorphous silicon carbide (SiC:H) having different carbon contents.

To show the effect on refractive index (n) and extinction coefficient (k) at variable wavelengths of the relative amounts of carbon (C) and silicon (Si) in SiC:H, various materials were produced. Ar at 2000 sccm and He at 4900 sccm were utilized as the dilution/carrying gases. The silane flow rate was maintained at 600 sccm for all of the samples. The top plasma power was 800 W. The chamber pressure was 4.8 Torr. The deposition took 12 seconds. All films were annealed after deposition using the above conditions. FIGS. 4 and 5 show the refractive index (FIG. 4) and extinction coefficient (FIG. 5) at various carbon contents. The carbon contents are defined as the amount of carbon divided by the total amount of carbon and silicon. The carbon contents tested ranged from 75% to 28.6%. As seen from FIGS. 4 and 5, as the carbon content decreases, the refractive index of the material increases and the k value for all the materials is less than the minimum range of the ellipsometry measurement (<0.01).

Table 1 below shows the flow rate of the propene ($C_3H_6$) for the samples ranging from 75% C to 37.5% C. The table also shows the refractive index measured at 825 nm for each sample and the post anneal thickness. The loss at 825 nm is only provided for two of the samples.

TABLE 1

| Carbon Content (%) | $C_3H_6$ flow rate (sccm) | Post anneal refractive index at 825 nm (n) | Extinction coefficient (k) |
|---|---|---|---|
| 75 | 600 | 2.066 | <0.01 |
| 66.67 | 400 | 2.172 | <0.01 |
| 60 | 300 | 2.238 | <0.01 |
| 50 | 200 | 2.441 | <0.01 |
| 45.21 | 165 | 2.527 | <0.01 |
| 37.5 | 120 | 2.67 | <0.01 |

Thus, embodiments of waveguides including novel core materials are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A waveguide comprising:
   a top cladding layer;
   a bottom cladding layer; and
   a core layer positioned between the top cladding layer and the bottom cladding layer, the core layer comprising amorphous hydrogenated silicon carbide (SiC:H) having a carbon content of not greater than 50% based on the total amount of carbon and silicon, or bismuth titanate and having a thickness from 75 nanometers (nm) to 150 nm.

2. The waveguide according to claim 1, wherein the core layer comprises amorphous hydrogenated silicon carbide (SiC:H).

3. The waveguide according to claim 2, wherein the core layer has a refractive inded of not less than 2.3.

4. The waveguide according to claim 2, wherein the carbon content of the amorphous hydrogenated silicon carbide (SiC:H) is not greater than 46% based on the total amount of carbon and silicon.

5. The waveguide according to claim 2, wherein the carbon content of the amorphous hydrogenated silicon carbide (SiC:H) is not greater than 38% based on the total amount of carbon and silicon.

6. The waveguide according to claim 1, wherein the core layer comprises bismuth titanate.

7. The waveguide according to claim 1, wherein the top cladding layer, the bottom cladding layer, or both independently comprise $SiO_2$, $MgF_2$, $Al_2O_3$, porous silica, or combinations thereof.

8. The waveguide according to claim 1, wherein the core layer has a thickness from 80 nanometers (nm) to 100 nm.

9. An apparatus comprising:
   a light source;
   a near field transducer (NFT); and
   a waveguide, the waveguide comprising:
      a top cladding layer;
      a bottom cladding layer; and a core layer positioned between the top cladding layer and the bottom cladding layer, the core layer comprising amorphous hydrogenated silicon carbide (SiC:H), or bismuth titanate and having a thickness from 75 nanometers (nm) to 150 nm, wherein the waveguide is configured to receive light from the light source and transmit it to the NFT.

10. The apparatus according to claim 9, wherein the core layer comprises amorphous hydrogenated silicon carbide (SiC:H).

11. The apparatus according to claim 9, wherein the carbon content of the amorphous hydrogenated silicon carbide (SiC:H) is not greater than 50% based on the total amount of carbon and silicon.

12. The apparatus according to claim 9, wherein the carbon content of the amorphous hydrogenated silicon carbide (SiC:H) is not greater than 38% based on the total amount of carbon and silicon.

13. The apparatus according to claim 9, wherein the core layer comprises bismuth titanate.

14. The apparatus according to claim 9, wherein the core layer has a thickness from 80 nm to 100 nm.

15. A method of forming a waveguide, the method comprising:

depositing a layer of hydrogenated amorphous silicon carbide (SiC:H); and annealing the deposited layer of hydrogenated amorphous silicon carbide (SiC:H), wherein the annealed hydrogenated amorphous silicon carbide (SiC:H) has a refractive index of not less than about 2.3 at about 830 nm.

16. The method according to claim 15, wherein the step of depositing the layer hydrogenated amorphous silicon carbide (SiC:H) comprises chemical vapor deposition (CVD).

17. The method according to claim 16, wherein the precursor gas for the carbon source comprises methane ($CH_4$), propene ($C_3H_6$), propane ($C_3H_8$), hexane ($C_6H_{14}$), xylene ($C_8H_{10}$), or combinations thereof; and the precursor gas for the silicon source comprises silane ($SiH_4$), disilane ($Si_2H_6$), tetrachlorosilane ($SiCl_4$), or combinations thereof.

18. The method according to claim 15, wherein the annealing occurs at a temperature of not less than about 220° C.

19. The method according to claim 16, wherein the CVD comprises use of a dilution/carrying gas that comprises argon (Ar), helium (He), or combinations thereof.

20. The method according to claim 15, wherein the hydrogenated amorphous silicon carbide (SiC:H) has a refractive index of not less than about 2.5 at about 830 nm.

* * * * *